United States Patent [19]

Ikenaga

[11] Patent Number: 4,701,053
[45] Date of Patent: Oct. 20, 1987

[54] MARK POSITION DETECTING METHOD AND APPARATUS

[75] Inventor: Osamu Ikenaga, Tokyo, Japan

[73] Assignee: Tokyo Shibaura Denki Kabushiki Kaisha, Kawasaki, Japan

[21] Appl. No.: 563,281

[22] Filed: Dec. 19, 1983

[30] Foreign Application Priority Data

Dec. 27, 1982 [JP] Japan ............................ 57-226703

[51] Int. Cl.⁴ ............................................ G01B 11/00
[52] U.S. Cl. ................................. 356/375; 250/548; 250/557; 356/400; 356/401
[58] Field of Search ............... 250/548, 557; 318/640; 356/399, 400, 401, 375

[56] References Cited

U.S. PATENT DOCUMENTS

| | | |
|---|---|---|
| 3,598,978 | 8/1971 | Rempert . |
| 4,200,393 | 4/1980 | Suzuki et al. ................. 356/400 |
| 4,203,064 | 5/1980 | Suzuki ........................... 250/561 |
| 4,292,576 | 9/1981 | Watts ............................ 356/400 |
| 4,301,470 | 11/1981 | Pagang ......................... 356/400 |

FOREIGN PATENT DOCUMENTS

0107765  8/1979  Japan ................................. 356/375

OTHER PUBLICATIONS

Carson et al., IBM Technical Disclosure Bulletin, vol. 21, No. 2, Jul. 1978.
An Automatic Reticle and Mask Defect Inspecting Apparatus, D. Awamura, "Denshi Zairyo", Jun. 1982.
"An Automatic Mask and Reticle Inspection System", Hal Yang, Proceeding of the Society of Photo-Optical Instrumentation Engineers, Mar. 31, 1982.

Primary Examiner—F. L. Evans
Attorney, Agent, or Firm—Oblon, Fisher, Spivak, McClelland, & Maier

[57] ABSTRACT

In a mark position-detecting apparatus, a rectangular reference mark is performed on a workpiece or photomask. The apparatus includes a movable table for supporting the photomask, a stationary light source for radiating light for forming a light spot on the photomask, a photodetector for detecting a change in light component transmitted through the mask, and a computer control section. The table moves forwardly and reversely in a Y-direction so that the photodetector scans two opposite edges of the reference mark in opposite directions in the Y-direction. The table is then moved forwardly and reversely in a X-direction so that the photodetector scans other two opposite mark edges. The signal detector thus produces edge position data representing the four mark edge scanned. The computer control section computes the coordinates of the mark center based on the edge position data.

23 Claims, 24 Drawing Figures

MARK POSITION DETECTING METHOD AND APPARATUS

BACKGROUND OF THE INVENTION

The present invention relates in general to a mark position detecting method and its apparatus. In particular, the present invention relates to a method of detecting a center position of a positioning reference mark formed on a mask for a pattern transfer by an energy beam, which is used for a mask defect inspection system, and an apparatus for executing the mark position detecting method.

In manufacturing the semiconductor integrated circuit (IC) chips, a reference pattern is formed on a mask for transferring a given micro-circuit pattern on a specimen. If the reference pattern contains a pattern defect such as disconnection, a manufacturing yield is reduced. To cope with this problem, a mask defect inspection system for inspecting a pattern defect prior to manufacturing the integrated circuits, has been developed. In this system, a mask member is illuminated to produce an optical signal representing a micro-circuit pattern formed on the mask member. This optical signal is compared with a theoretical data signal obtained on the basis of the design data used for forming the mask pattern. The optical signal representing a defect-contained mask pattern is not coincident with the theoretical data signal. The mask defect inspecting system detects the result of the comparison and judges whether or not a defect is present in the mask pattern.

For inspecting a pattern defect by using the mask defect inspecting system, it is essential to exactly align an optical system in this inspection system with the mask member in a high accuracy. An insufficient accuracy in the alignment between the optical system and the photomask results in an inaccuracy of the mask defect inspection. At the present stage, it is difficult to effectively and automatically detect the coordinates of a center position of a small positioning reference pattern previously formed on the mask.

SUMMARY OF THE INVENTION

It is therefore an object of the present invention to provide a new and improved mark position detecting method and its apparatus in which a center position of a positioning reference mark previously formed on a photomask may automatically be detected with a high precision.

According to the present invention, there is provided an apparatus for detecting a position of a reference mark which is provided on a workpiece and has first and second edge portions disposed opposite to and substantially parallel with each other in a first direction and third and fourth edge portions opposite to and substantially parallel with each other in a second direction normal to the first direction. The apparatus comprises a movable table device for supporting the workpiece, a light source device for radiating light for forming a light spot on the workpiece on the table device, a photodetector device for detecting the edges of the reference mark, and a computer control device for producing first to fourth edge data. In accordance with the mark center-detecting apparatus, light is radiated onto the workpiece supported by a movable table structure so as to form a light spot on the workpiece. The table structure is then moved so that the photodetector device relatively scans the first and second edge portions in opposite directions in the third direction normal to the first and second edge portions. A change in the light component is generated when the photodetector device crosses the first and second edge portions. The change in the light component is incident on the photodetector device and detected thereby, which device thus produce first and second edge data representing the positions of the first and second mark edge portions. Thereafter, the table structure is moved in such a manner that the photodetector device scans the third and fourth edge portions in opposite directions in the fourth direction normal to the third and fourth edges. The photodetector device detects a change in the light component, which is generated when the photodetector device crosses the third and fourth mark edges, to produce third and fourth edge position data. The computer control device calculates the coordinates of the mark center on the basis of the above first to fourth edge position data thus obtained. It should be noted that the aforementioned workpiece includes a mask for transferring a pattern using electron beam, light beam, or X-ray.

BRIEF DESCRIPTION OF THE DRAWINGS

The present invention is best understood by reference to the accompanying drawings, in which.

DETAILED DESCRIPTION OF THE PREFERRED EMBODIMENT

Before proceeding with the description of a preferred embodiment according to the present invention, a conventional mark position detecting technique will be described referring to FIG. 1. A photodetector 2 is provided for detecting a misalignment of an optical system in a photomask defect inspecting system with a rectangular positioning reference mark 4 formed on the photomask. The photodetector 2 is comprised of a plurality of photosensor elements arrayed in a line. By convention, a center position of the positioning reference mark 4 on the photomask is detected by the photodetector 2. The detected center position of the positioning reference mark 4 is then set at a proper target position to exactly align the optical system with the photomask.

Figure 1A:
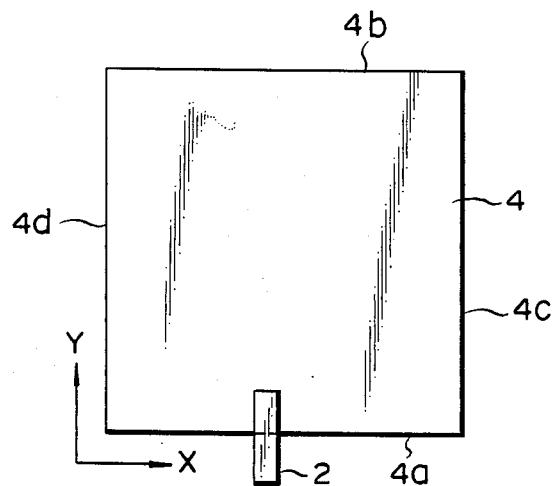
FIGS. 1A and 1B are diagrams illustrating relative positions of a photodetector and a reference mark useful in explaining a conventional mark position detecting method.

For a linear mark edge 4a, a table (not shown) bearing a photomask thereon is moved so that the photodetector (signal-detector) 2 partially overlaps with the mark edge 4a, while being disposed near the mark edge 4a. As shown in FIG. 1A, the mark edge 4a is one of the mask edges 4a and 4b of the positioning reference mark 4, which are disposed opposite to and parallel with each other and extend in a direction (X-direction in FIG. 1) orthogonal to a longitudinally extending direction of the photodetector 2 (Y-direction). When the photomask on the table is illuminated with light emitted from a light source (not shown), light transmitted through the photomask is incident on the detector 2. Then, the detector 2 generates electrical signals representing the information contained in the mask-transmitted light. More exactly, the plurality of photosensor elements sense the light, which contains the mask-transmitted light and has a specific distribution of incident light intensities. The output signals, or the output data, of the photosensor elements are compared with a predetermined threshold data. The output data compared are converted into digital signals, i.e. binary signals. The digitized signal contains a train of bits which are arrayed with two sections, one containing the successive bits with one logical state, while the other containing the successive bits with the other logical state. A point where the logical state changes in the bit train, i.e. the boundary between those sections, provides a first edge position data representing a first edge of the positioning reference mark 4, i.e. the mark edge 4a. A second edge, i.e. the edge 4b, disposed on the opposite side of and parallel with the mark edge 4a, is also position-detected in a similar manner to that for the mark edge 4a position detection. A center position of the positioning reference mark 4 as viewed in the Y-direction, i.e. the Y-coordinate of the mark center position, is computed on the basis of the first and second edge position data.

Figure 1B:
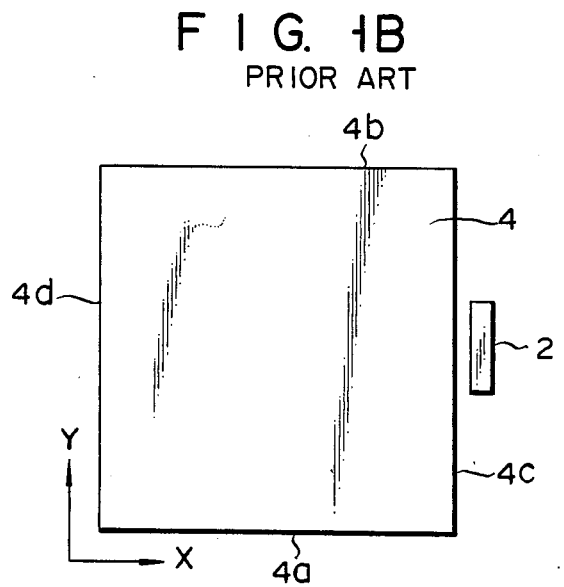

The table is then moved so that the photodetector 2 is positioned substantially parallel with and close to a mark edge 4c of the positioning reference mark 4. As shown in FIG. 1B, the mark edge 4c is one of the mark edges 4c and 4d linearly extending in the longitudinal extension (Y-direction) of the linear array of the photosensor elements of the photodetector 2. Following this table positioning, similarly, the mask placed on the table is illuminated with light. A specific photosensor element among the photosensor elements of the signal-detector 2 thus detects transmission light signal from the mask to generate an electrical detection data. The data is compared with a predetermined threshold data, and are converted into digital signals. This processing is repeated while continuously moving the table in a specific direction, i.e. X-direction, normal to the mark edge 4c. A third edge position data representing the position of the edge 4c is obtained by detecting a boundary between the detection data derived from the specific photosensor element and the threshold data. Further, the mask bearing table is continuously moved against the edge 4d opposite to and parallel with the third edge 4c, in the direction normal to the edge 4d. The mask-transmitted signal derived from the specific photosensor element is processed in a similar manner to the above one, and a fourth edge position is obtained. Then, the center position on the positioning reference mark 4 as viewed in the X-direction is computed using the third and fourth edge positions thus obtained. Finally, the center position, i.e. its X- and Y-coordinates, on the mark is obtained.

The conventional mask position detecting technique, however, has the following diadvantages. In case of detecting the position of the mark edge disposed in the direction perpendicular to the signal-detector 2, the mark edge detecting accuracy is limited due to the pitch of photosensor elements. Further, if the photosensor element, even single, is defective in the photodetector 2, the mark edge detecting accuracy is degraded depending on a size of the light sensing area of the defective element. Further, for detecting the mark edge position of the edge disposed parallel with the photodetector 2, the mark edge position is analyzed using the digital signal collected by the photodetector 2 in synchronism with the movement of the table. For this reason, an accuracy of the mark edge position detection is directly limited to by a noise signal contained in the photosensor signal. Furthermore, one of the paired edges is position-detected at a change point from a glass portion of the mark to a chromium portion. The other edge is position-detected at a change point from the chronium pattern to the glass portion. Therefore, the determination of the mark center position is inevitably accompanied by an appreciable error. In other words, the table moving directions for detecting the paired mark edges disposed oppositely and parallel with each other, are the same. Therefore, the table moving speed causes an error in the determination of the edge position, leading to an inaccurate determination of the mark center position.

Figure 2:
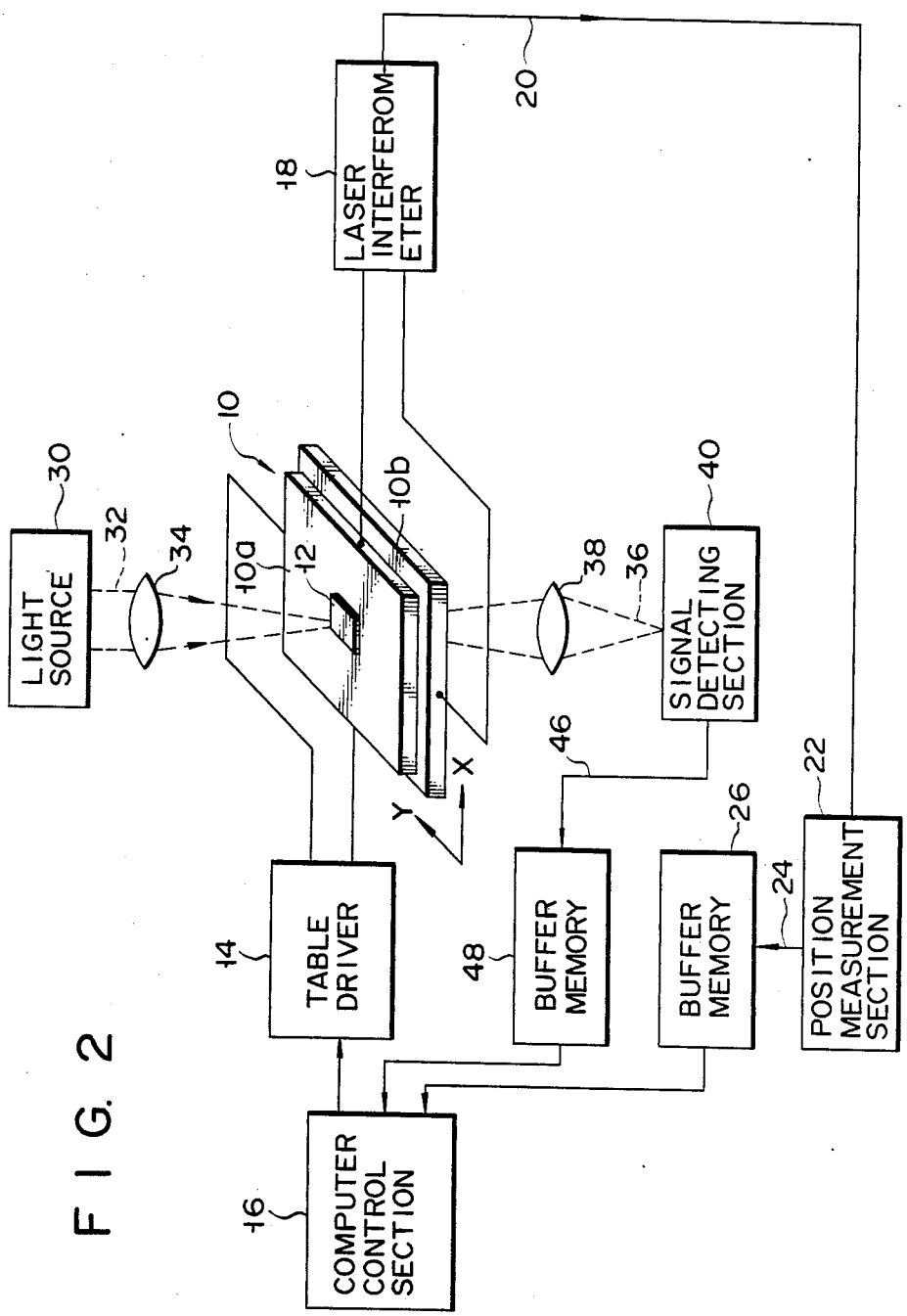
FIG. 2 is a block diagram schematically illustrating a mark position detecting apparatus according to one embodiment of the present invention.

Turning now to FIG. 2, there is shown an overall arrangement of a mark position detecting apparatus which is a preferred embodiment of the present invention. A movable table structure 10 is made up of an X-table 10a linearly slidable in one direction, i.e. an X-direction, and a Y-table 10b linearly slidable in the other direction, i.e. a Y-direction, orthogonal to the X-direction. The X-table 10a is mounted on the Y-table 10b. A photomask 12 is stably placed on the table structure 10 in a known manner. The photomask 12 has a substrate (not shown) made of transparent material with a good light-transmittance such as glass. A table driver 14 is connected to the X- and Y-tables 10a, 10b, and properly drives the tables 10a and 10b under control of a computer control section 16 including a computer. A laser interferometer 18 measures the actual moving distances of the tables 10a and 10b to generate a measuring signal 20. The measuring signal 20 is supplied to a position measurement section 22. The position measurement section 22 measures positions of the tables 10a and 10b, to generate position data 24. The position data 24 is temporarily stored in a data buffer memory 26 and supplied to a computer control section 16 at an appropriate time.

Figure 3:
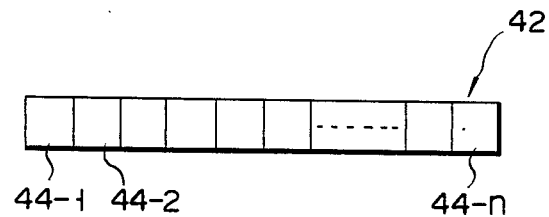
FIG. 3 is a diagram illustrating a photodetector formed of a plurality of photosensor elements provided in the FIG. 2 apparatus.
Figure 4:
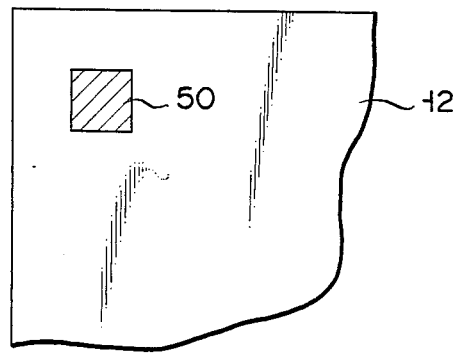
FIG. 4 shows a partial enlarged view illustrating a positioning mark previously formed on a photomask placed on the table of the mark position detecting apparatus according to the present invention.

A known light source 30 is disposed above the table structure 10. Light 32 radiated from the light source 30 is focused by a first lens 34 and the focused light is used as a light beam for forming a spot on the photomask 12. Light 36 transmitted through the mask 12 passes through a second lens 38 disposed under the table structure 10 and is incident on a signal detecting section 40. The signal detecting section 40 is constructed of a photodetector 42 having a plurality of photosensor elements 44-1, ..., 44-n, as shown in FIG. 3. The transmitted light 36 coming through the second lens 38 forms an image on a photodetector 42. The image covers the overall surface of the photodetector 42. Detection data 46 obtained by the photodetector 42 is temporarily stored in another buffer memory 48 and is supplied to the computer control section 16.

With the arrangement shown in FIG. 2, the X- and Y-tables 10a and 10b constituting the table structure 10 are respectively movable bidirectionally along the X- and the Y-axes under control of the computer control section 16. That is, the X-table 10 is linearly movable in both the forward and backward directions along the X-axis, while the Y-table 10b is linearly movable in the both directions along the Y-axis.

Description will be given how the mask position detecting apparatus thus arranged detects the mark position. To begin with, the photomask 12 is stably placed on the table structure 10. The mask 12 has a thin positioning reference mark 50 on a predetermined surface area. The positioning reference mark 50 is made of chromium and rectangular in shape. In the present embodiment, the mark 50 as a square thin plate is formed on a predetermined area of the mask 12, together with a microcircuit pattern (not shown).

Figure 5:
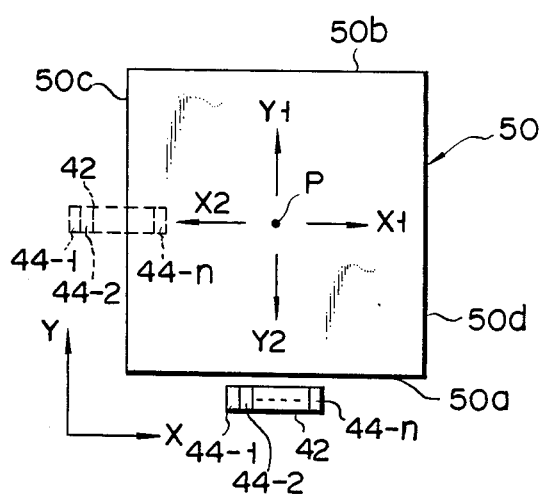
FIG. 5 is a diagram illustrating relative positions of a photodetector and a reference mark useful in explaining a mark position detecting method according to the present invention.
Figure 6A:
FIGS. 6A to 6D show a set of waveforms of detected signals at specific time points from all the photosensor elements of the photodetector of FIG. 3 in a Y-direction edge scanning step.
Figure 6B:
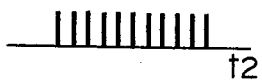
Figure 6C:
Figure 6D:

The driver 14 drives the table structure 10 on which the photomask 12 is placed in such a manner that the optical axis of an optical system containing the light source 30 and the first lens 34 becomes coincident with the vicinity of the center of the mark 50 (rough positioning-alignment). After the positioning of the table structure 10, the light source 30 emits the light beam 32. The light 32 is focused by the lens 34 and applied to the positioning reference mark 50 on the photomask 12. At the same time, the Y-table 10b is driven in one direction, for example, a direction as indicated by Y1 in FIG. 5. Thus, the light spot, which is formed on the mask 12 by the light emitted from the light source 30, linearly moves toward a first edge 50a or in the Y-direction. During this movement, the photodetector 42 having the photosensor array in the signal detecting section 40 receives the transmitted light 36 from the photomask 12 to generate a plurality of scanning data signals representing a shape of the positioning reference mark 50 in a successive manner. The scanning data signals are analog signals varying with the actual amount of light incident upon the sensors, and are sequentially stored in the buffer memory 48. During the course of the above operation, the laser interferometer 18 supplies the position measurement section 22 with measuring signals 20 representing the data of the table movement distances when the plurality of scanning signals are detected by the photodetector 42. On the basis of the measuring signals 20, the position measurement section 22 computes an exact position of the Y-table 10b when each scanning signal 46 is detected, and stores the result of the computation or the position data 24 in the data buffer memory 26.

Figure 7A:
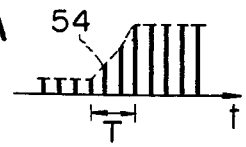
FIGS. 7A to 7D are a set of characteristic diagrams illustrating time variations of the detected signals output from specific photosensor elements in the photodetector of FIG. 3 in the Y-direction edge scanning step.
Figure 7B:
Figure 7C:
Figure 7D:
Figure 8A:
FIGS. 8A to 8D show a set of waveforms of detected signals at specific time points from all the photosensor elements of the photodetector of FIG. 3 in an X-direction edge scanning step.
Figure 8B:
Figure 8C:
Figure 8D:
Figure 9A:
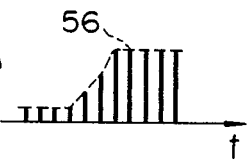
FIGS. 9A to 9D are a set of characteristic diagrams illustrating time variations of the detected signals output from specific photosensor elements in the photodetector of FIG. 3 in the X-direction edge scanning step.
Figure 9B:
Figure 9C:
Figure 9D:
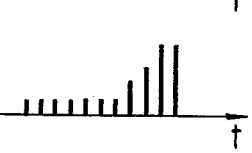
Figure 10A:
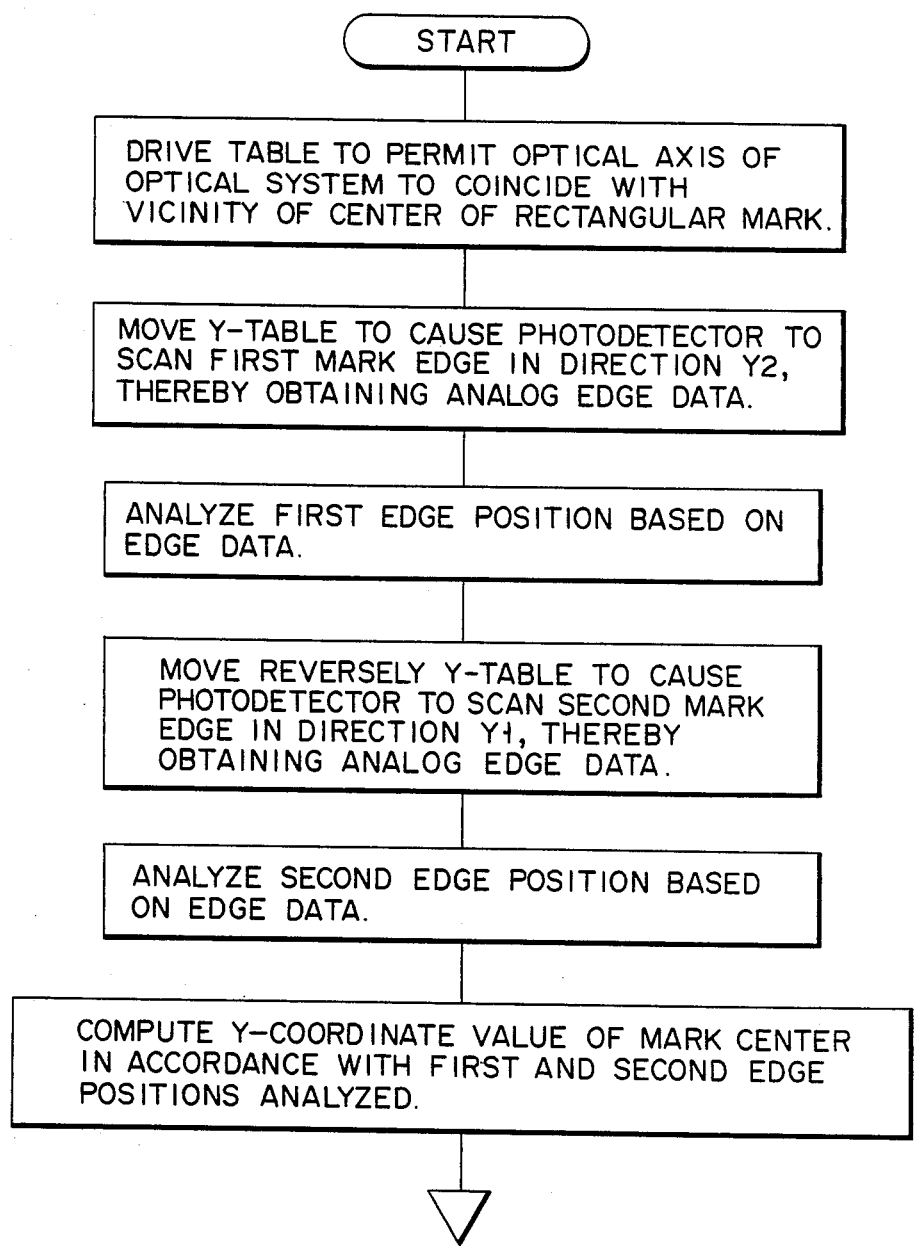
FIGS. 10A and 10B cooperate to form a flowchart illustrating an execution flow of main steps in a mark position detecting method according to the present invention.
Figure 10B:
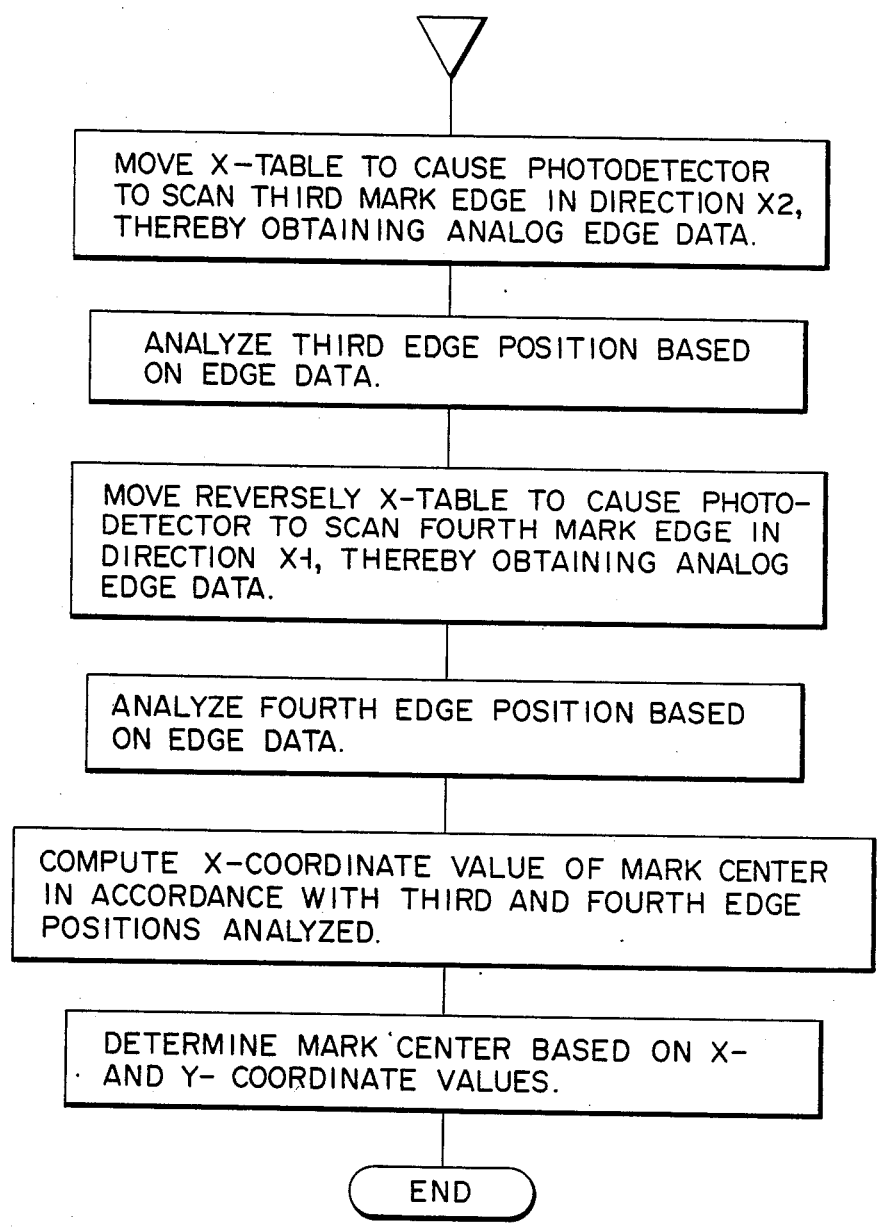

In the above mark edge detecting operation, the photodetector 42 included in the signal detecting section 40 produces scanning signals as shown in FIGS. 6A-6D. FIGS. 6A-6D schematically illustrate levels of the signals produced by all the photosensor elements 44 at time points t1-t4 during a period that the photodetector 42 passes the mark edge 50a. As seen from these figures, the signal level increases as the overlapping area of the photodetector 42 with the mark 50 decreases. The data stored in these memories 26 and 48 are supplied to the computer control section 16 at an appropriate time. For obtaining a signal level variation with time at the individual photosensor elements 44-1, ..., 44-n of the photodetector 42 using the scanning signals stored in the buffer memory 48, the computer control section 16 analyzes the position data stored in the data buffer memory 26 and the output signal levels derived from the individual sensor elements respectively corresponding to the position data. As a result, signal level variation with time of the output signal (or scanning signal), which is generated from each photosensor element in the photodetector 42, may be obtained as illustrated in FIGS. 7A to 7D. The computer control section 16 computes the edge position of the mark edge 50a based on the change of the scanning signals. The computation of the edge position is performed on each of the time variations of the scanning signals drived from the sensor elements as illustrated in FIGS. 7A-7D. A detected signal level variation of one sensor element 44-1, for example, is illustrated in FIG. 7A. In FIG. 7A, an envelope waveform 54 enveloping the peak points of the individual signals is obtained. A crossing point at which the envelope waveform curve crosses a predetermined threshold level is determined as a mark edge position. All edge position data thus obtained from the all sensor elements 44 are subjected to the statistical analysis (averaging process, for example) to finally determine the mark edge position with high precision.

The next step is to detect a position of the edge portion 50b which is on the other side of the edge portion 50a extending in the Y-direction. The Y-table 10b is driven, by the table driver 14, to move in an opposite direction Y2 to that of the above movement. Subsequently, the signal detecting section 40 is driven. Then, the photodetector 42 of the signal detector 40 generates the scanning signals on the portion of the photomask 12 near the second edge 50b extending parallel to the first edge 50a. The scanning signals are stored in the buffer memory 48. At this time, the position data on the Y-table 10b generated when the scanning signals are obtained are stored into the data buffer memory 26 by the position measurement section 22 in a similar manner. On the basis of those data, the actual position of the second mark edge 50b is computed by the computer control section 16 in a similar manner to the above one. A position of the center P of the positioning reference mark 50, i.e. the Y-coordinate of the center P, is easily computed.

The Y-table 10b is moved again to an initial position to allow the optical axis of the optical system in this apparatus to be substantially coincident with the center of the mark 50. Then, the X-table 10a is started to move in the direction of X1 in FIG. 5. In this embodiment, at this time, the photosensor elements 44-1, ..., 44-n constituting the photodetector 42, which are linearly arrayed in the X-direction, go successively crossing the third edge 50c in the direction of X2. FIGS. 8A to 8D illustrate respectively the detected signals output from all the sensors 44 of the photodetector 42 at some time points t5 to t8, for example. The time sequence t5 to t8 does not mean that it directly follows the time sequence t1 to t4 in FIG. 6. In those figures, the signal levels are arrayed from left to right corresponding to those signals generated by the photosensor elements 44-1, . . . , 44-n, respectively. This fact follows that intensities of the light incident on the sensors located under the positioning reference mark 50, viz. located on the right side in the figures, are weaker than as those sensors which are located closer to the center of the positioning reference mark 50. Those scanning data are stored into the buffer memory 48. The table position data obtained by the position measurement section 22 corresponding to those data are stored into the other buffer memory 26. Time variations of the output signal levels of each of the sensor elements 44 can be illustrated as shown in FIGS. 9A to 9D on the basis of the analysis made as in case of the Y-direction scanning. The position of the third edge 50c of the mark 50 is computed using an envelope wave 56 directly representing a signal level variation of each sensor element. It should be noted that, in this case, measurement data representing the mark edge position, which are determined on the basis of the output signals from the photosensing elements, include edge positions shifted from the center of the photodetector 42 by deviation values, which are n times (n= +1, +2, . . . ) larger than or smaller than the alignment pitch of the photosensor elements. However, the corresponding positive and negative deviation values in one direction are cancelled each other, when computing a mean value of the measured position data. As a result, there can be obtained a mark edge position data accurately corresponding to the center of the photodetector 42. Thereafter, the X-table 10a is moved in the opposite direction X2 to that of X1. Through a similar operation to the above one, a position of the fourth edge 50d is obtained. Finally, a position of the mark center P on the X-axis, i.e. an X-coordinate Xp of the mark center P, is computed using the third and fourth edge data. In this way, the coordinate values (Xp, Yp) of the mark center P is exactly obtained. Finally, the mark center position thus obtained is made coincident with the optical axis of the optical system by driving the table 10. At this point, the positioning work of the mask 12 is completed.

According to the mark position detecting technique of the present invention, it is possible to extremely accurately detect the center position of the rectangular mark 50 by using the photodetector 42 with a linear sensor array. A reason for this is that, in detecting the positions of the mark edges in both the X- and Y-directions, the level changing points corresponding to the edge positions can elaborately be determined on the basis of multi-level or analog change (this is made clear by the envelope curves 54 or 56) of the detected scanning signals from a plurality of sensor elements. Therefore, the present invention can completely solve the problem inherent to the prior art using the digital detected signal in binary form, in which when the sensor element, even single, is defective, the edge position detecting accuracy is degraded. According to the present invention, even when some of the photosensor elements are defective, the detecting accuracy is little degraded, to provide a stable mark position detecting operation.

Another useful feature of the present invention follows. In detecting two opposite edges of the rectangular mark 50, for example, the edges 50a and 50b, the light spots formed on the photomask 12 by the light 32 emitted from the light source 30 respectively move in opposite directions to scan these edges. Such motion of the light spots is realized by driving the X-and Y-table 10a and 10b in opposite directions during the scanning of two mark edges opposing to each other. In other words, the photodetector located so as to receive the light spot is moved, at the two opposite mark edges, for scanning towards or away from the mark center. For example, in the step to obtain the Y-coordinate of the mark center P for detecting the positions of the first and second edges 50a and 50b, the positioning reference mark 50 is relatively and linearly moved from the Y1 and Y2 directions (or Y2 and Y1 directions), which are opposite to each other. Therefore, the positioning reference mark 50 is relatively moved from the chromium mark pattern 50 to the glass substrate, when both the mark edges 50a and 50b are detected. With the feature of the scanning isotropy, the error due to the anisotropic scanning can be eliminated, to impove the mark edge detecting accuracy. Specifically, even if errors are contained in the detected position data of the edges 50a and 50b, errors contained in the measured position data of the first and second edges 50a and 50b are cancelled one by the other through the computing process on the mark center P.

As described above, in the mark position detecting method according to the present invention, the analog signals of the individual sensors linearly arrayed in the photodetector are collected in synchronism with the table positions. Therefore, the mark edge positions can be detected with a high accuracy without adverse influences from the sensor pitch and noise signal components. Moreover, in the method according to the present invention, for determining the first and second edge positions of the mark, the directions of the table motion are set opposite to each other. This feature eliminates the need for the correction by the table motion speed. Further, the analog signals from the sensor array are analyzed corresponding to the table positions. This feature eliminates the anisotropic scanning in the X- and Y-directions. Additionally, the data for analyzing the positions of the pattern edges parallel with the linear photodetector are collected while moving the table in the opposite directions. The data collecting direction of the photodetector is either of the directions from the glass portion to the chromium portion and the chromium portion to the glass portion. Therefore, errors due to the scanning operations in those directions are cancelled one by the other. Furthermore, even when a defective sensor element is contained in the sensor array, the edge portion detecting accuracy is negligibly degraded by the presence of the defective element.

Although the present invention has been shown and described with respect to a particular embodiment, various changes and modifications which are obvious to a person skilled in the art to which the invention pertains are deemed to lie within the spirit and scope of the invention.

For example, the mark used is not limited to the rectangular shape, but may be an L-shaped one. Further, the transmitted light from the mark may be substituted by the reflecting light from the mark for obtaining the mark edge position data. The present invention is applicable not only for the mask defect inspecting apparatus, but also for other apparatuses in use of the mask positioning.

What is claimed is:

1. An apparatus for detecting a postion of a reference mark which is provided on a workpiece to have first and second edge portions disposed opposite to and substantially parallel with each other in a first direction, and third and fourth edge portions disposed opposite to and substantially parallel with each other in a second direction normal to the first direction, said apparatus comprising:

movable table means for supporting said workpiece;

light source means for radiating light on said workpiece positioned on said table means;

photodetector means for detecting an image of the edge portions of said reference mark;

edge position detecting means for moving said table means relative to said photodetector means in such a manner that said table means moves forward and backward in the first direction and said photodetector means scans the first and second edge portions in the opposite scanning directions; for detecting a change of light, which is generated when said photodetector means detects the image of said first and second edge portions and incident on said photodetector means, to produce first and second edge data representing the positions of said first and second edge portions; for moving said table means forward and backward in the second direction so that said photodetector means scans the third and fourth edge portions in the opposite scanning directions; and for detecting a change in light, which is generated when said photodector means detects the image of said third and fourth edge portions and incident on said photodetector means, to produce third and fourth edge data representing the positions of said third and fourth edge portions; and coordinate computing means connected to said edge position detecting means, for computing coordinates of the mark center based on the first to fourth data thus obtained.

2. The apparatus according to claim 1, wherein said coordinate computing means comprises:

computer means, connected to said photodetector means, for receiving from said photodetector means a plurality of scanning signals with signal levels varying with time according to a change in the light component when said photodetector means detects one mark edge portion, for computing an envelope waveform of signal levels of each of said scanning signals, and for analyzing a position of said one mark edge portion at a detector error smaller than the pitch in an array of said photodetector means on the basis of said envelope waveform.

3. The apparatus according to claim 2, wherein said photodetector means includes a plurality of photosensor elements which detect the change in light, for successively generating the first to fourth edge data, each of said photosensor elements generating a multilevel scanning signal, which serves as one of the first to fourth edge data.

4. The apparatus according to claim 3, wherein said photosensor element are linearly arrayed in one of the first and second directions.

5. An apparatus for detecting a position of a reference mark which is provided on a workpiece to have first and second edge portions disposed opposite to and substantially parallel with each other in a first direction, and third and fourth edge portions disposed opposite to and substantially parallel with each other in a second direction normal to the first direction, said apparatus comprising:

movable table means for supporting said workpiece;

light source means for radiating light on said workpiece positioned on said table means;

photodetector means for detecting an image of the edge portions of said reference mark;

edge position detecting means for moving said table means relative to said photodetector means in such a manner that said table means moves forward and background in a third direction which crosses the first and second edge portions and which is inclined with respect to the first direction, such that said photodetector means scans the first and second edge portions in the opposite scanning directions; for detecting a change in light, which is generated when said photodetector means detects the image of said first and second edge portions and incident on said photodetector means, to produce first and second edge data representing the positions of said first and second edge portions; for moving said table means forward and backward in a fourth direction which crosses the third and fourth edge portions and is inclined with respect to the second direction so as to be normal to the third direction, such that said photodetector means scans the third and fourth edge portions in the opposite scanning directions; and for detecting a change in light, which is generated when said photodetector means detects the image of said third and fourth edge portions incident on said photodetector means, to produce third and fourth edge data representing the positions of said third and fourth edge portions; and coordinate computing means connected to said edge position detecting means for computing coordinates of the mark center based on the first to fourth data thus obtained.

6. The apparatus according to claim 5, wherein said coordinate computing means comprises:

computer means, connected to said photodetector means, while receiving from said photodetector means a plurality of scanning signals with signal levels varying with time according to a change in the light component when said photodetector means detects one mark edge portion, for computing an envelope waveform of signal levels of each of said scanning signals, and for analyzing a position of said one mark edge portion at a detection error smaller than the pitch in an array of said photodetector means on the basis of said envelope waveform.

7. The apparatus according to claim 6, wherein said photodetector means includes a plurality of photosensor elements, which detect the change in light, for successively generating the first to fourth edge data, each of said photosensor elements generating a multi-level scanning signal which serves as one of the first to fourth edge data.

8. The apparatus according to claim 6, wherein said photosensor elements are linearly arrayed in one of the first and second directions.

9. The apparatus according to claim 6, wherein said photosensor elements are linearly arrayed in one of the third and fourth directions.

10. A method for detecting a position of a reference mark which is provided on a workpiece to have first and second edge portions disposed opposite to and substantially parallel with each other in a first direction, and third and fourth edge portions disposed opposite to and substantially parallel with each other in a second direction normal to the first direction, said method comprising the steps of:

- radiating light on said workpiece supported by a movable table structure;
- detecting an optical image from the workpiece by a photodetector device;
- moving said table structure relative to the photodetector device in such a manner that said table means moves forward and backward in the first direction and such that said photodetector device scans the first and second edge portions in the opposite scanning directions, detecting a change in a light component, which is generated when the photodetector device detects the image of the first and second edge portions incident on the photodetector device, to thereby produce first and second edge data representing the positions of the first and second edge portions;
- moving said table structure forward and backward in the second direction such that said photodetector device scans the third and fourth edge portions in the opposite scanning directions, detecting a change in a light component, which is generated when the photodetector device detects the image of the third and fourth edge portions incident on the photodetector device, to thereby produce third and fourth edge data representing the positions of said third and fourth edge portions; and
- computing the coordinates of the mark center based on the first to fourth data thus obtained.

11. The method according to claim 10, wherein said first and second edge positions scanning step further comprises the steps of:

- moving said table structure in the first direction so that the photodetector device detects the first edge portion, and producing a plurality of first multi-level scanning signals in response to a change in a light component at the time of the movement of said table structure;
- moving said table structure backward in the second direction so that the photodetector device detects the second edge portion, and producing a plurality of second multi-level scanning signals in response to a change in a light component at the time of the movement of said table structure; and
- producing the first and second edge data in response to the first and second scanning signals.

12. The method according to claim 11, wherein said third and fourth edge positions scanning step further comprises the steps of:

- moving said table structure in the first direction so that the photodetector device detects the third edge portion, and producing a plurality of third multi-level scanning signals in response to a change in a light component at the time of the movement of said table structure;
- moving said table structure backward in the second direction so that the photodetector device detects the second edge portion, and producing a plurality of fourth multi-level scanning signals in response to a change in a light component at the time of the movement of said table structure; and
- producing the third and fourth edge data in response to the third and fourth scanning signals.

13. The method according to claim 10, wherein the change in the light component is detected by an edge position detecting section including a plurality of photosensing elements, said edge position detecting section successively generating the first to fourth edge data, and each photosensing element generates a multi-level scanning signal which serves as one of the first to fourth edge data.

14. The method according to claim 13, wherein a plurality of scanning signals with signal levels varying with time according to a change in the light component which is generated when said photodetector device detects one mark edge portion is supplied from said photosensor elements to a computer section, and said computer section computes an envelope waveform of signal levels of each of said scanning signals to analyze a position of the said one mark edge portion at a detection error smmaller than the pitch in the array of said photosensor elements on the basis of said envelope waveform.

15. The method according to claim 14, wherein said photosensing elements are linearly arrayed in one of the first and second directions.

16. The method according to claim 14, wherein said light component contains one of the light transmitted through and reflecting from said workpiece.

17. A method for detecting a position of a reference mark which is provided on a workpiece to have first and second edge portions disposed opposite to and substantially parallel with each other in a first direction, and third and fourth edge portions disposed opposite to and substantially parallel with each other in a second direction normal to the first direction, said method comprising the steps of:

- radiating light on said workpiece supported by a movable table structure;
- detecting an optical image from the workpiece by a photodetector device;
- moving said table structure relative to the photodetector device in such a manner that said table means moves forward and backward in a third direction which crosses the first and second edge portions and which is inclined with respect to the first direction, and such that said photodetector device scans the first and second edge portions in the opposite scanning directions, detecting a change in a light component, which is generated when the photodetector device detects the images of the first and second edge portions incident on the photodetector device, to thereby produce first and second edge data representing the positions of the first and second edge portions;
- moving said table structure forward and backward in a fourth direction which crosses the third and fourth edge portions and is inclined with respect to the second direction so as to be normal to the third direction, and such that said photodetector device scans the third and fourth edge portions in the opposite scanning directions, detecting a change in a light component, which is generated when the photodetector device detects the images of the third and fourth edge portions incident on the photodetector device, to thereby produce third and fourth edge data representing the positions of said third and fourth edge portions; and
- computing coordinates of the mark center based on the first to fourth data thus obtained.

18. The method according to claim 17, wherein said first and second edge portions-scanning step further comprises the steps of:
moving said table structure in the third direction so that the photodetector device detects the first edge portion, and producing a plurality of a first multi-level scanning signals in response to a change in a light component at the time of the movement of said table structure;
moving reversely said table structure in the third direction so that the photodetector device detects the second edge portion, and producing a plurality of second multi-level scanning signals in response to a change in a light component at the time of the movement of said table structure; and
producing the first and second edge data in response to the first and second scanning signals.

19. The method according to claim 18, wherein said third and fourth edge portions-scanning step further comprises the steps of:
moving said table structure in the fourth direction so that the photodetector device detects the third edge portion, and producing a plurality of a third multi-level scanning signals in response to a change in a light component at the time of the movement of said table structure;
moving reversely aaid table structure in the fourth direction so that the photodetector device detects the fourth edge portion, and producing a plurality of a fourth mulit-level scanning signals in response to a change in a light component at the time of the movement of said table structure, and
producing the third and fourth edge data in response to the third and fourth scanning signals.

20. The method according to claim 17, wherein said light component change is detected by an edge position detecting section including a plurality of photosensing elements, said edge position detecting section generates successively the first to fourth edge data, and each photosensing element generates a multi-level scanning signal which signal serves as one of the first to fourth edge data.

21. The method according to claim 20, wherein a plurality of scanning signals with signals levels varying with time according to a change in the light component which is generated when said photodetector device detects one mark edge portion is supplied from said photosensor elements to a computer section, and said computer section computes an envelope waveform of signal levels of each of said scanning signals to analyze a position of said one mark edge portion at a detection error smaller than the pitch in the array of said photosensor elements on the basis of said envelope waveform.

22. The method according to claim 21, wherein said photosensing elements are linearly arrayed in one of the third and fourth directions.

23. The method according to claim 21, wherein said light component contains one of the light transmitted through and reflecting from said workpiece.

* * * * *